(12) United States Patent
Bui et al.

(10) Patent No.: US 7,864,603 B1
(45) Date of Patent: Jan. 4, 2011

(54) MEMORY ELEMENTS WITH LEAKAGE COMPENSATION

(75) Inventors: John Henry Bui, Sunnyvale, CA (US); Triet M. Nguyen, San Jose, CA (US); David E. Jefferson, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 397 days.

(21) Appl. No.: 12/037,911

(22) Filed: Feb. 26, 2008

(51) Int. Cl.
*G11C 7/18* (2006.01)
(52) U.S. Cl. .................. 365/189.19; 365/189.11; 365/203; 365/189.05; 365/230.01; 365/189.15
(58) Field of Classification Search ........... 365/189.19, 365/189.11, 203, 230.01, 189.05, 154, 189.15, 365/189.04
See application file for complete search history.

(56) References Cited

U.S. PATENT DOCUMENTS

| | | | |
|---|---|---|---|
| 5,673,231 A | 9/1997 | Furutani | |
| 5,748,520 A | 5/1998 | Asaka et al. | |
| 6,552,949 B1 | 4/2003 | Silla et al. | |
| 6,826,074 B2 | 11/2004 | Yamauchi | |
| 2007/0090857 A1* | 4/2007 | Shau | 326/81 |

* cited by examiner

*Primary Examiner*—Thong Q Le
(74) *Attorney, Agent, or Firm*—Treyz Law Group; G. Victor Treyz

(57) ABSTRACT

Integrated circuits with memory elements are provided. The memory elements may be arranged in an array. Data lines may be used to load data into the memory elements and may be used to read data from the memory elements. The memory elements may be used to store configuration data on a programmable logic device integrated circuit. Each memory element may have an output that supplies a programmable transistor gate with a static control signal. Data reading circuitry may be coupled to each data line to read data from an addressed memory element on that data line. The data reading circuitry for each data line may include a precharge transistor and an output latch. The output latch may contain crosscoupled inverters. An inwardly-directed inverter in the output latch may have a pull-up transistor that is connected in series with a current source.

20 Claims, 11 Drawing Sheets

MEMORY ELEMENTS WITH LEAKAGE COMPENSATION

BACKGROUND

This invention relates to memory elements, and more particularly, to memory element reading circuitry with leakage current compensation.

Integrated circuits often contain volatile memory elements. Typical volatile memory elements are based on cross-coupled inverters (latches) and are used to store data. Each memory element can store a single bit of data. In integrated circuits such as programmable logic device integrated circuits, volatile memory elements are used to store configuration data.

Memory elements are typically arranged in arrays. Data may be loaded into the memory elements of the array and may be read from the memory elements of the array using data lines. There is typically a data line associated with each row or column of the array.

An output latch at the end of each data line may be used in conveying data signals from the data line to circuitry outside of the memory array. The output latch may include a pair of cross-coupled inverters. One of the cross-coupled inverters may be directed outwards and may drive data from the data line onto an output terminal. The other of the cross-coupled inverters may be directed inwards and may feed the output terminal signal back onto the data line. During read operations, a memory element of interest is addressed using an address signal. The data bit on this memory elements is driven onto the data line and, through the outwardly-directed inverter of the output latch, is driven in inverted form onto the output terminal.

Each data line is typically connected to numerous memory elements, each of which potentially has a non-negligible amount of associated leakage current. A p-channel metal-oxide-semiconductor pull-up transistor in the inwardly-directed inverter of the output latch can be used to help pull the data line high when the signal on the output terminal is low. Proper operation of the memory array circuitry depends on the ability to select a suitable strength for this pull-up transistor. If the pull-up transistor is made too strong, it may not be possible to drive a stored "zero" data bit from an addressed memory element onto the data line. If the pull-up transistor is made too weak, leakage currents from the memory elements that are associated with the data line may overwhelm the pull-up transistor and pull the data line to ground. In this situation, it may not be possible to drive a stored "one" data bit from an addressed memory element onto the data line.

As integrated circuit technology advances, it is becoming increasingly desirable to reduce transistor linewidths and to reduce the power supply voltages used on a circuit. These advances may help to improve the power consumption on an integrated circuit while allowing for increases in transistor density. Nevertheless, integrated circuits with reduced power supply voltages are increasingly susceptible to manufacturing and operating parameter variations. Conventional memory array arrangements may provide insufficient margin to accommodate these variations when implemented using modern integrated circuit technology. For example, it may be difficult or impossible to appropriately size pull-up transistors in memory array output latches using conventional designs.

It would therefore be desirable to be able to provide improved memory element reading circuitry for integrated circuits.

SUMMARY

In accordance with the present invention, integrated circuits are provided with arrays of memory elements. The memory elements may each have a pair of cross-coupled inverters. Data lines may be used to load data into the memory elements and may be used to read data from the memory elements. Each memory element may have an address transistor. The address transistors may be used to selectively route data from the memory elements to the data lines.

The memory elements may be used to store data. For example, the memory elements may be used to store configuration data on a programmable logic device integrated circuit. In this type of scenario, each memory element may have an output that supplies the gate of a respective programmable transistor with a static control signal. The programmable transistors may make up programmable core logic on a programmable logic device integrated circuit.

Data reading circuitry may be coupled to each data line to read data from an addressed memory element on that data line. The data reading circuitry for each data line may include a precharge transistor and an output latch. The output latch may contain cross-coupled inverters. An outwardly-directed inverter in the output latch may be used to drive data signals that are being read onto an output line. An inwardly-directed inverter in the output latch may be used to feed back signals from the output line to the data line. The inwardly-directed inverter may be formed from an n-channel metal-oxide transistor and a p-channel metal-oxide-semiconductor transistor. The p-channel metal-oxide-semiconductor transistor may serve as a pull-up transistor that pulls the data line to a positive power supply voltage when the output line is at a logic high level. A current source may be connected in series with the p-channel metal-oxide-semiconductor pull-up transistor. A transistor may be connected in parallel with the current source.

Further features of the invention, its nature and various advantages will be more apparent from the accompanying drawings and the following detailed description.

DETAILED DESCRIPTION

Figure 1:
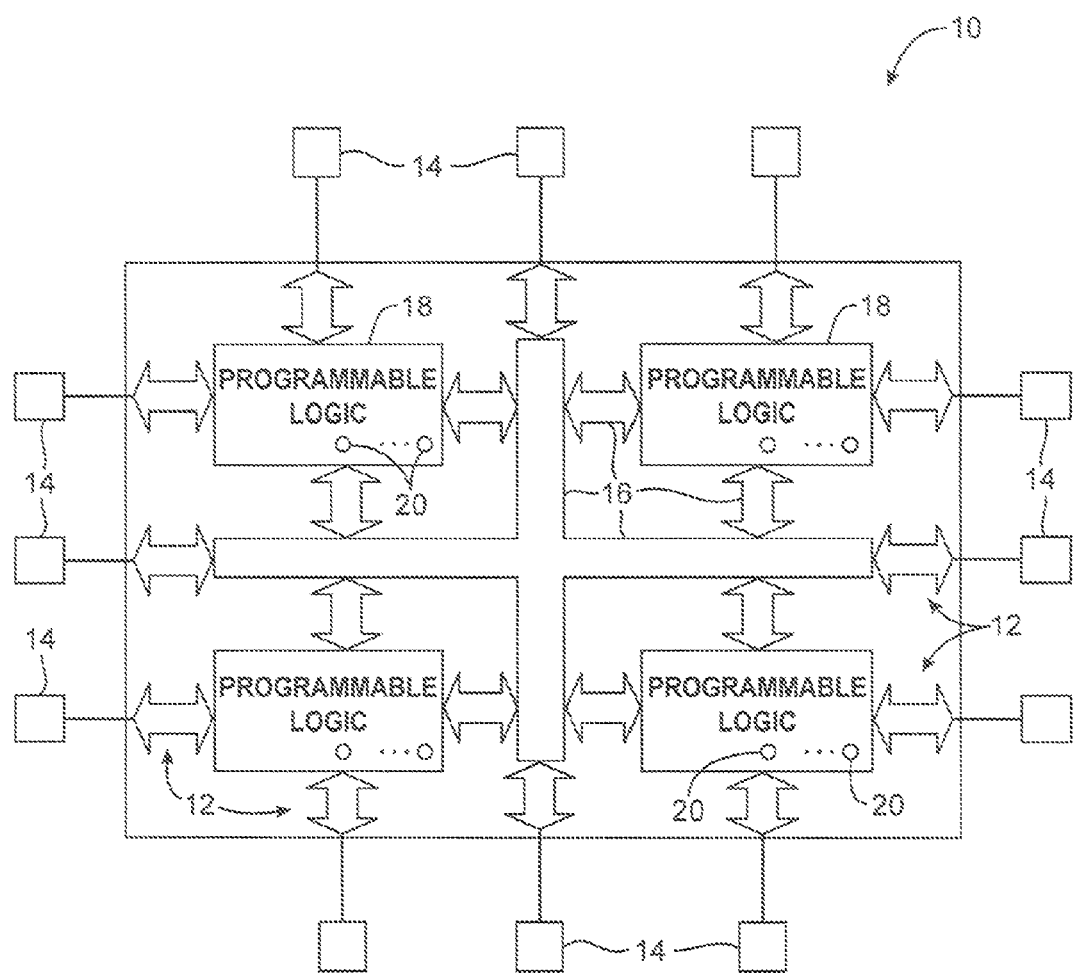
FIG. 1 is a diagram of an illustrative integrated circuit with an array of memory elements such as a programmable logic device integrated circuit in accordance with an embodiment of the present invention.

The present invention relates to memory elements and integrated circuits that contain memory elements. The invention also relates to circuits for loading data into memory elements and for reading data out of memory elements. Memory element data may be read to confirm that the data has been loaded properly or for other purposes.

The integrated circuits that contain the memory elements may be memory chips, digital signal processing circuits with memory arrays, microprocessors, application specific integrated circuits with memory arrays, programmable logic device integrated circuits in which memory elements are used for configuration memory, or any other suitable integrated circuits. For clarity, the present invention will sometimes be described in the context of programmable logic device integrated circuits in which volatile memory elements are used to store configuration data. This is, however, merely illustrative. The memory elements and memory element circuitry of the invention may be used in the context of any suitable integrated circuits.

Programmable logic device integrated circuits use programmable memory elements to store configuration data. During the programming of a programmable logic device, configuration data is loaded into the memory elements. During operation of the programmable logic device, each memory element provides a static output signal. The static output signals that are supplied by the memory elements serve as control signals. These control signals are applied to programmable logic on the integrated circuit to customize the programmable logic to perform a desired logic function. In a typical arrangement, each static output signal serves as a gate control signal that is applied to the gate of an n-channel or p-channel metal-oxide-semiconductor transistor.

The programmable logic in which the n-channel and p-channel transistors are contained makes up part of the logic core of the programmable logic device and is therefore sometimes referred to as programmable core logic. Core logic is powered using a positive power supply voltage that is generally referred to as Vcc and a ground voltage that is generally referred to as Vss. Typical Vcc and Vss values are 1.0 volts and 0 volts, respectively. It is expected that advances in semiconductor technology will allow smaller power supply voltages to be used in future integrated circuits, so Vcc values of less than 1.0 volts may be used. Values of Vcc larger than 1.0 volts and non-zero ground voltages Vss may also be used in an integrated circuit if desired.

To reduce power consumption, there is an ongoing trend in the semiconductor industry to reduce the magnitude of the power supply voltages that are used. Reducing power supply voltages may help to reduce power consumption, but can lead to design challenges. For example, reduced power supply voltages can lead to challenges in fabricating reliable memory array circuitry. In accordance with the present invention, additional design margin may be provided for memory array read circuitry, even in circuits that use reduced power supply voltages.

The memory array circuitry may be formed on any suitable integrated circuit. For example, the memory array circuitry may be formed on a programmable logic device integrated circuit. An illustrative integrated circuit on which the memory array circuitry may be formed is programmable logic device integrated circuit 10 of FIG. 1.

As shown in FIG. 1, programmable logic device integrated circuit 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains memory elements 20 that can be loaded with configuration data (also called programming data) using pins 14 and input/output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Some of the transistors may be p-channel metal-oxide-semiconductor (PMOS) transistors. Most of these transistors are generally n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. With one suitable approach, complementary metal-oxide-semiconductor (CMOS) integrated circuit technology is used to form the memory elements 20, so CMOS-based memory element implementations are described herein as an example. In the context of programmable logic device integrated circuits, the memory elements store configuration data and are therefore sometimes referred to as configuration random-access memory (CRAM) cells.

The memory elements may be loaded from any suitable source. With one illustrative arrangement, the memory elements are loaded from an external erasable-programmable read-only memory and control chip called a configuration device via pins 14 and input/output circuitry 12.

The memory elements 20 are generally arranged in an array pattern. In a typical modern programmable logic device, there may be millions of memory elements 20 on each chip. During programming operations, the array of memory elements is provided with configuration data. Once loaded with configuration data, the memory elements 20 selectively control portions of the circuitry in the programmable logic 18 and thereby customize its functions so that it will operate as desired. Data may be read from the array of memory elements using read circuitry. For example, configuration data may be read back from the memory elements following programming to verify that a programmable logic device has been programmed correctly.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
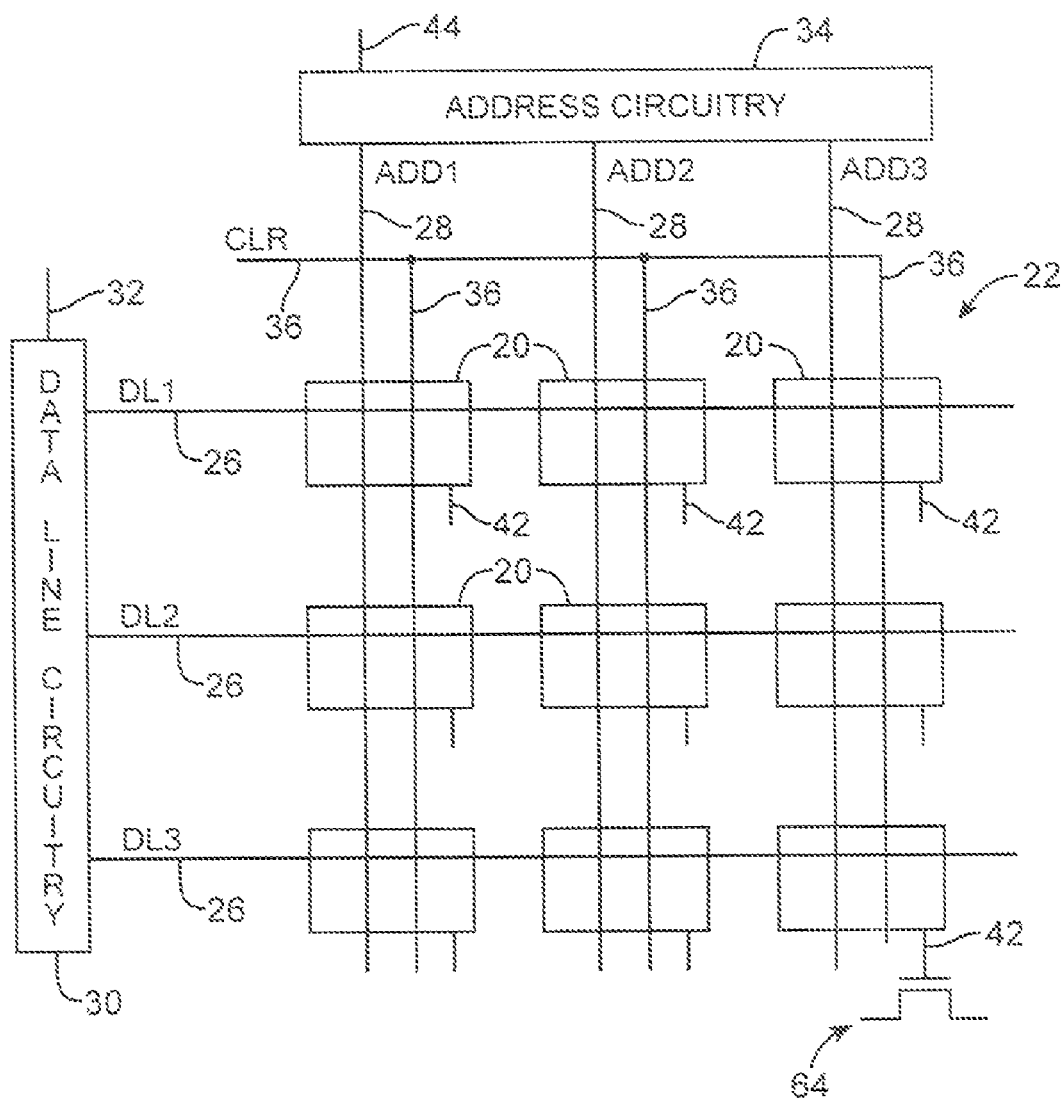
FIG. 2 is a diagram of an illustrative memory element array in accordance with an embodiment of the present invention.

When memory elements are arranged in an array, horizontal and vertical conductors and associated circuitry may be used to load the memory elements with configuration data and may be used to read data from the memory elements. An illustrative arrangement for data loading and data reading on device 10 is shown in FIG. 2. The arrangement of FIG. 2 has a 3×3 array 22 of memory elements 20. (Actual memory arrays typically have hundreds or thousands of rows and columns, but a 3×3 array is used as an example.) The array 22 may receives power supply voltages Vcc and Vss through suitable power supply lines. In a typical arrangement, positive power supply voltage Vcc may be about 1.0 volts and ground voltage Vss may be about 0 volts. If desired, the magnitude of Vcc (and Vss) the voltage Vss may vary as a function of time. For example, Vcc may be lowered during data writing operations to make it easier to drive data bits into memory elements 20. As another example, Vcc may be raised during normal operation, so that the static control signals that are applied to the gates of the transistors in programmable logic 18 are elevated (e.g., 1.6 volts). These are merely illustrative examples. The positive and ground power supply voltages for memory elements 20 may have any suitable values.

As shown in FIG. 2, a clear line 36 (labeled CLR) may be used to clear the contents of the memory array 22. After the array has been cleared, configuration data may be loaded. After configuration data has been loaded, the contents of memory elements 20 in array 22 may be read.

Configuration data may be provided in series to registers in data line circuitry 30 via input 32. During data writing operations, the configuration data may be provided in parallel to array 22 via the DL1, DL2, and DL3 data lines 26. During data read operations, data may be read from array 22 via the data lines 26.

Address decoder circuitry in address circuitry 34 may receive addressing information via input 44 during data writing and data reading operations. In response, the address decoder may assert a desired one of the address lines 28 (i.e., ADD1, ADD2, or ADD3). When an address line is asserted in a given column during data write operations, the data on the data lines 26 is loaded into the memory elements 20 in that column. The array may be filled by systematically loading the memory elements in each of the columns of the array. After the array has been completely loaded with configuration data, the static control output 42 of each memory element 20 produces a corresponding static control signal for controlling the gate of a pass transistor or other logic component on the programmable logic device (e.g., a pass transistor such as pass transistor 64). When an address line is asserted in a given column during data read operations, data from the memory elements in the addressed column is driven onto the data lines 26. Data line output latches and other read circuitry in data line circuitry 30 may be used in handling the data signals from data lines 26.

Figure 3:
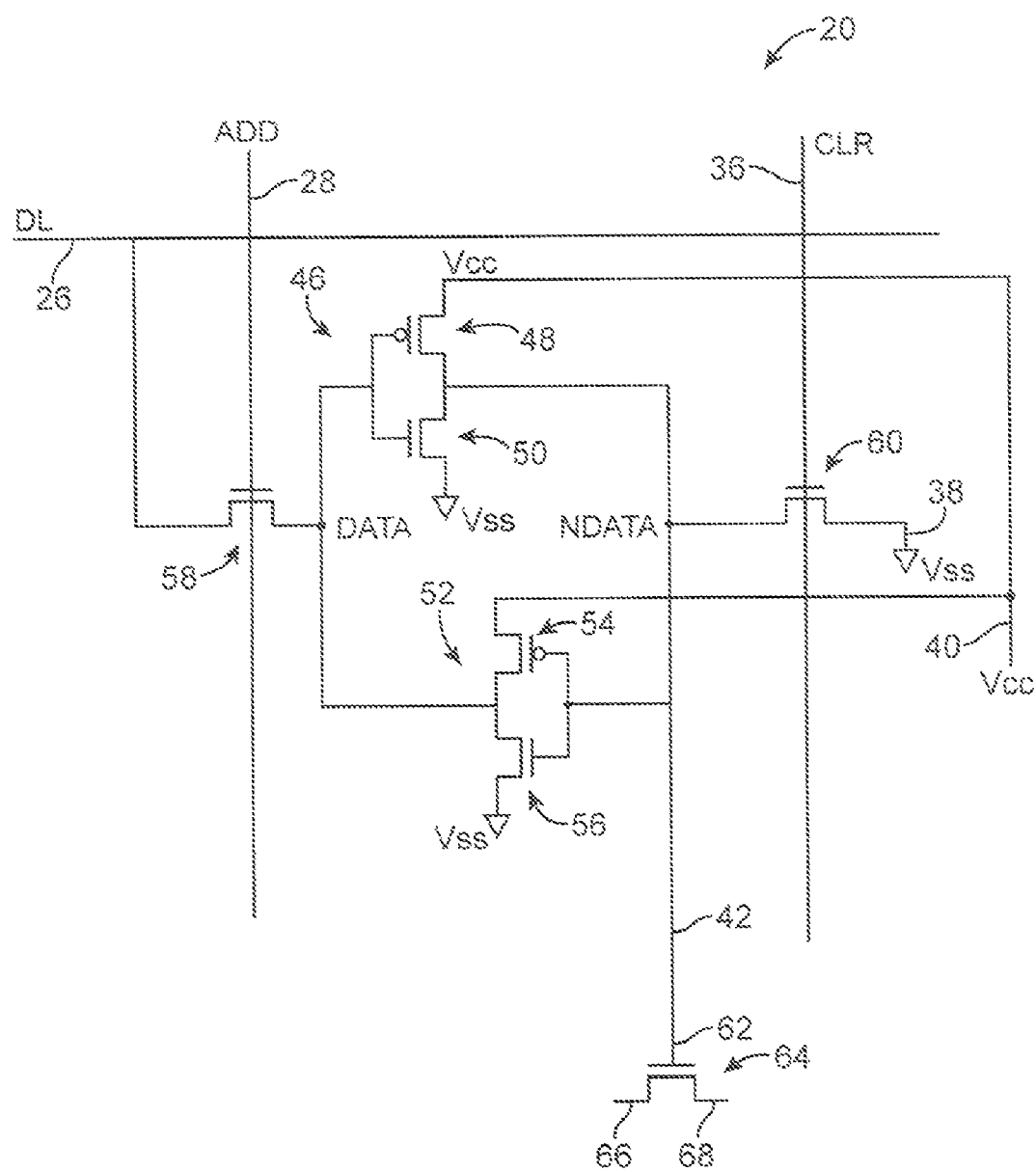
FIG. 3 is a diagram of an illustrative memory element in accordance with an embodiment of the present invention.

A memory element 20 of the type that may be used in array 22 of FIG. 2 is shown in FIG. 3. As shown in FIG. 3, the memory element 20 may be formed from two cross-coupled inverters—inverter 46 and inverter 52. Inverter 46 may have a p-channel metal-oxide-semiconductor (PMOS) transistor 48 and an n-channel metal-oxide-semiconductor (NMOS) transistor 50. Inverter 52 may have a PMOS transistor 54 and NMOS transistor 56. The NMOS clear transistor 60 may be turned on during clear operations by activating clear line 36. This connects complementary data signal NDATA to ground 38 and clears the memory element 24. During normal operation, the value of the control signal on control output line 42 is determined by the value of the complementary data signal NDATA.

When address line 28 is taken high during a write operation, NMOS address transistor 58 is turned on and the signal DL on data line 26 is driven into the memory element 20. The stored data bit in memory element 20 is represented by signal DATA in FIG. 3 and is represented in complementary form by NDATA. If the signal on line 26 is high, signal DATA remains high and the memory element 24 remains in its cleared (erased) state. In the erased state, memory element 20 may be said to contain a logic low or a "zero" bit. The output NDATA on line 42 in this situation will be low. If the signal on line 26 is low during the write operation, DATA will be taken low and, due to the inversion of the low DATA signal by inverter 46, the signal NDATA will be taken high. This makes the output line 42 high. When DATA is low and NDATA is high, memory element 20 may be said to contain a "one" or logic high bit and may be referred to as being "programmed."

The NDATA control signal is applied to the gate 62 of pass transistor 64. When NDATA is low, pass transistor 64 is off. When NDATA is high, pass transistor 64 is on and data is allowed to flow between line 66 and line 68.

Figure 4:
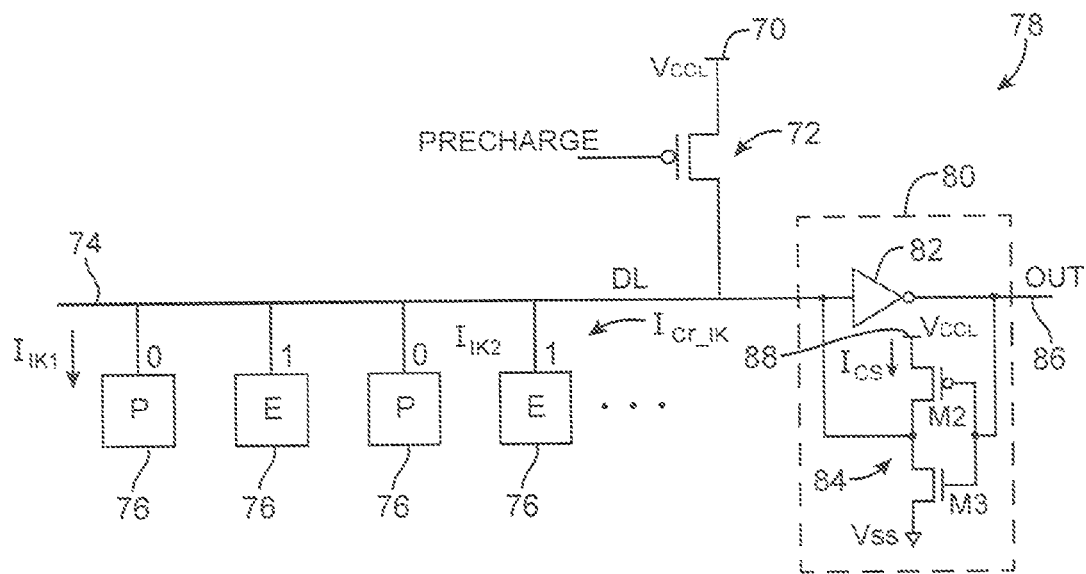
FIG. 4 is a diagram of a row of a memory element array with a conventional output circuit.

FIG. 4 shows a conventional data line 74, associated memory elements 76, and associated read circuitry 78. Precharge transistor 72 is connected between positive power supply terminal 70 and data line 74. Memory elements 76 are coupled to data line 74 through respective address transistors. For a given data line 74, some of the memory elements will generally be erased ("E") and some of the memory elements will generally be programmed ("P"). Memory elements that are erased contain high (logic "one") DATA and tend to exhibit negligible leakage currents. Memory elements that are programmed contain low (logic "zero") DATA and have associated leakage currents when their associated address transistors are turned off. In the example of FIG. 4, there are two programmed memory elements 76, having respective leakage currents Ilk1 and Ilk2. In general, there will be hundreds or thousands of memory elements connected to a given data line. The leakage currents exhibited by the memory elements contribute to a total leakage current Icr_lk. In the FIG. 4 example, Icr_lk is equal to the sum of Ilk1 and Ilk2.

Read circuitry 78 typically includes a precharge transistor 72 and an output latch 80. Prior to reading the voltage on data line 74, precharge transistor 72 is turned on by taking signal PRECHARGE low. This connects terminal 70 to line 74 and pulls the voltage on line 74 high to a positive voltage supplied on terminal 70.

Output latch 80 contains an outwardly-directed inverter 82 that drives data signals DL from line 74 onto output line 86 as inverted output signals OUT. Cross-coupled inverter 84 is used to feed signal OUT back onto line 74. Inverter 84 is inwardly-directed, because it drives signals onto line 74 from output line 86. Inverter 84 includes PMOS transistor M2 and NMOS transistor M3. The PMOS transistor M2 is connected to positive power supply terminal 88 and serves as a pull-up transistor for data line 74. In a typical scenario, positive power supply terminals 70 and 88 are connected to a source of positive voltage Vcc1 (e.g., a voltage equal to Vcc).

Proper design of the output latch 80 requires that the PMOS pull-up transistor M2 be constructed with the proper strength. If M2 is too strong, it will not be possible to drive a DATA signal from an addressed memory element 20 onto data line 74 during a read operation. If M2 is too weak, memory element leakage currents will overwhelm M2, producing erroneous results at output OUT during read operations. Transistor M2 has a drain-source current of Ics. During programming, the memory element on line 74 that has been addressed and whose address transistor is turned on will draw a current of Icr_pd. The proper strength for pull-up transistor M2 is one that maintains current Ics greater than leakage current Icr_lk and less than memory element current Icr_pd.

FIGS. 5-12 are timing diagrams that show the problems that may arise if pull-up transistor M2 is not sized properly (e.g., in a conventional read circuit arrangement of the type shown in FIG. 4).

Figure 5:
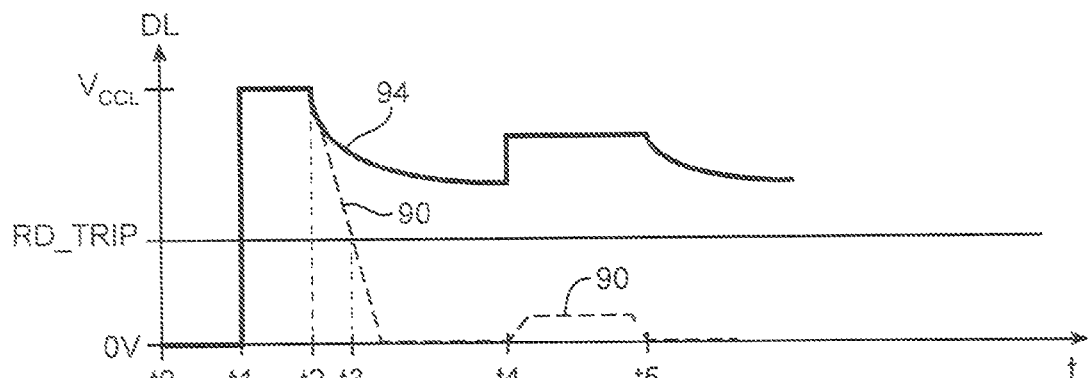
FIGS. 5, 6, 7, and 8 are graphs showing how a stored one (logic high) data bit in a memory element may or may not be read successfully depending on the performance of an integrated circuit memory array data line output latch.
Figure 6:
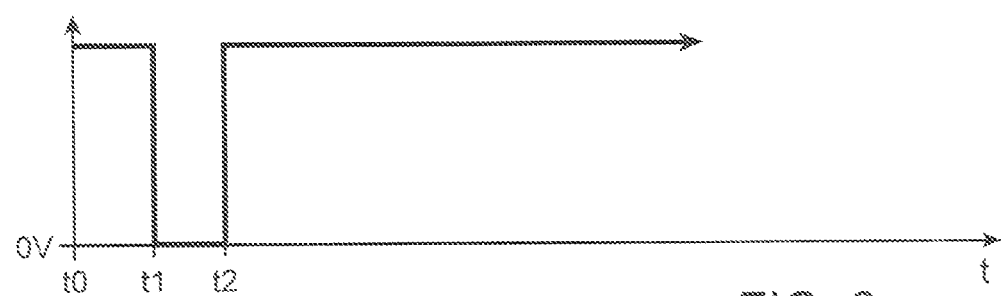
Figure 7:
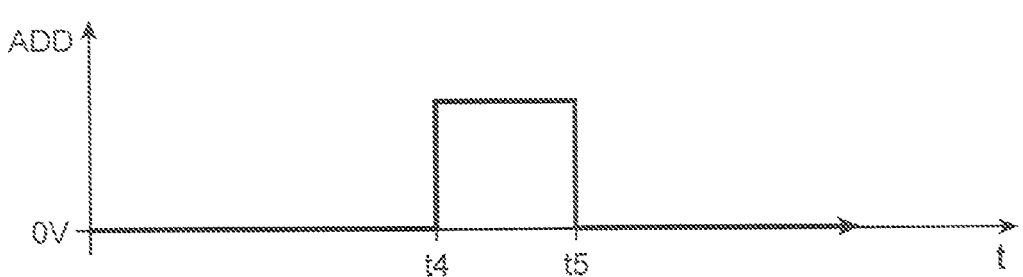
Figure 8:
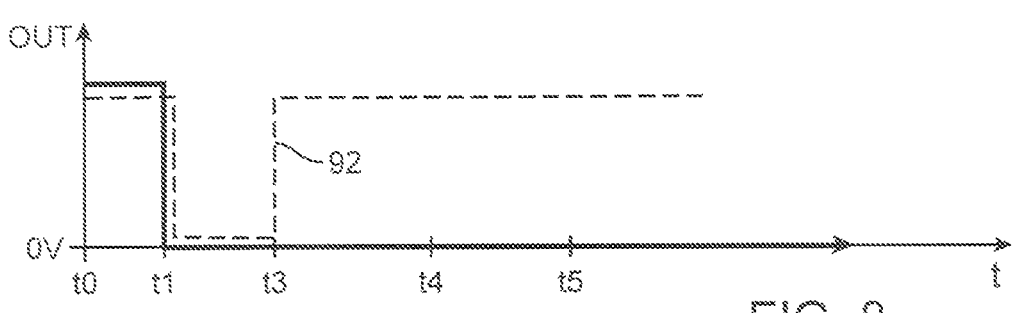

The graphs of FIGS. 5-8 show signals involved when attempting to read out data from a given erased (cleared) memory element (i.e., a memory element 20 whose DATA is high). As shown in FIG. 6, signal PRECHARGE is high between times t0 and t1, so precharge transistor 72 is off and data line DL is isolated from the precharge voltage on terminal 70. As a result, the signal on data line DL is equal to the value of the previous signal that was read out. In the example of FIGS. 5-8, the previous signal on DL was low, so DL in the trace of FIG. 5 has a value of 0 between times t0 and t1. Inverter 82 inverts the low signal on line 74, so output signal OUT is high for times less than t1, as shown in FIG. 8.

At time t1, signal PRECHARGE is taken low, as shown in FIG. 6. This turns on precharge transistor 72. When precharge transistor 72 is turned on, line 74 is electrically connected to positive power supply node 70. As a result, signal DL on line 74 is pulled high, as shown in FIG. 5.

As shown in FIG. 6, the precharge transistor control signal PRECHARGE is taken high at time t2. This turns off precharge transistor 72. In a typical situation, at least some of the memory elements 76 that are associated with a given data line such as data line 74 of FIG. 4 have associated low DATA signals. These memory elements contribute to memory element leakage current Icr_lk. After the precharge pull-up voltage from precharge transistor 72 is released, the leaking memory elements 76 tend to pull down the voltage DL on line 74, whereas the PMOS pull-up transistor M2 tends to pull up the voltage DL on line 74.

If transistor M2 is too weak relative to the leakage current Icr_lk, the voltage DL will fall according to dashed line 90 of FIG. 5. At time t3, the voltage DL that is represented by dashed line 90 will fall below the trip point (RD_TRIP) of output latch 80. While DL is above RD_TRIP, the output OUT on output 86 of output latch 80 will be low (e.g., Vss). When DL falls below RD_TRIP at time t3, the output voltage OUT of latch 80 goes high, as indicated by dashed line 92 of FIG. 8. At times t4 to t5, the address signal ADD that is associated with the given erased memory element is asserted (FIG. 7). There will be a small rise in signal DL at time t4 due to the voltage of the high DATA signal on the addressed memory element, but this small rise will be less than voltage threshold RD_TRIP, as shown in FIG. 5. As a result, the output of output latch 80 will not change state at time t4 and will remain high, as shown in FIG. 8. The high output signal OUT between times t4 and t5 is erroneous and will result in a read error.

If, on the other hand, transistor M2 is not too weak relative to the memory element leakage currents on line 74, the voltage DL will fall according to solid line 94 of FIG. 5. Because M2 is sufficiently strong relative to the memory element leakage (i.e., because Ics of M2 is greater than Icr_lk), the voltage of signal DL will drop to a voltage that is greater than RD_TRIP. As shown in FIG. 7, the address signal ADD that is associated with the given erased memory element is asserted at times t4 to t5. When the address signal is asserted, the address transistor associated with the given erased memory cell is turned on and the high DATA signal on the addressed memory element pulls data line signal DL high at time t4, as shown in FIG. 5. The output of output latch 80, which was pulled low during the precharge operations will remain low between times t3 and t4, because the voltage DL remains above RD_TRIP during this period. When address signal ADD is asserted between times t4 and t5, DL goes high and, due to the inversion of output latch 80, signal OUT remains low, as indicated by FIG. 8. The low signal level of OUT between times t4 and t5 accurately reflects that the DATA contents of the memory element is high and will result in an accurate read operation.

As the discussion of FIGS. 5-8 makes clear, transistor M2 must not be constructed so as to be too weak, or pull-up transistor current Ics will be overwhelmed by leakage current Icr_lk and read errors will occur.

Figure 12:
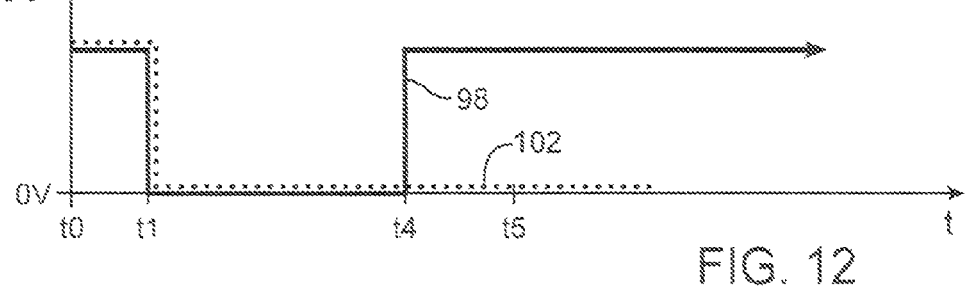

The graphs of FIGS. 9-12 show signals involved when attempting to read out data from a given programmed memory element (i.e., a memory element 20 whose DATA is low). Between times t0 and t1, signal PRECHARGE is high, so precharge transistor 72 is off and data line DL is isolated from the precharge voltage on terminal 70. As a result, the signal on data line DL is equal to the value of the previous signal that was read out. As with the example of FIGS. 5-8, the previous signal on DL in the example of FIGS. 9-12 was low, so DL in the trace of FIG. 9 has a value of 0 between times t0 and t1. Inverter 82 inverts the low signal on line 74, so output signal OUT is high for times less than t1, as shown in FIG. 12.

Figure 9:
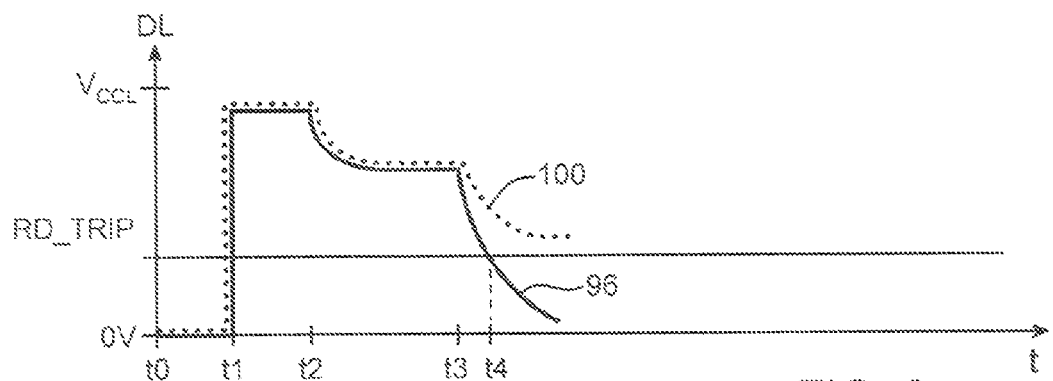
FIGS. 9, 10, 11, and 12 are graphs showing how a stored zero (logic low) data bit in a memory element may or may not be read successfully depending on the performance of an integrated circuit memory array data line output latch.
Figure 10:
Figure 11:
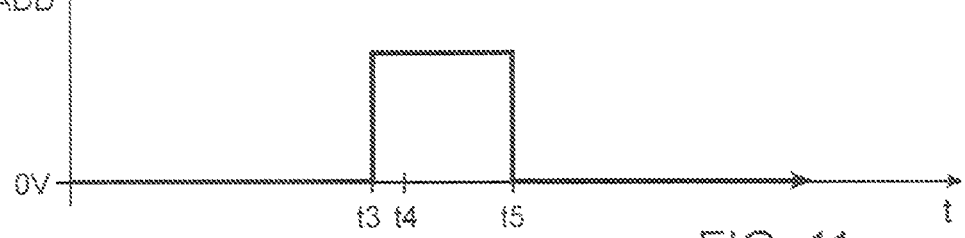

At time t1, signal PRECHARGE is taken low, as shown in FIG. 10. This turns on precharge transistor 72. When precharge transistor 72 is turned on, line 74 is electrically connected to positive power supply node 70. As a result, signal DL on line 74 is pulled high at time t1, as shown in FIG. 9.

As shown in FIG. 10, the precharge transistor control signal PRECHARGE is taken high at time t2. This turns off precharge transistor 72. At least some of the memory elements 76 that are associated with a given data line such as data line 74 of FIG. 4 generally have associated low DATA signals. These memory elements contribute to memory element leakage current Icr_lk. As described in connection with the example of FIGS. 5-8, after the precharge pull-up voltage from precharge transistor 72 is released at time t2, the leaking memory elements 76 tend to pull down the voltage DL on line 74, whereas the PMOS pull-up transistor M2 tends to pull up the voltage DL on line 74. This causes the voltage DL on line 74 to drop after time t2. In the example of FIGS. 9-12, it is assumed that M2 is not too weak relative to the leakage current Icr_lk, so that the voltage DL does not drop below output latch threshold switching voltage RD_TRIP at times between t2 and t3, as shown in FIG. 9. As shown in FIG. 12, output signal OUT is therefore low during this time.

Between times t3 and t5, address signal ADD (FIG. 11) is asserted to read out the contents of the programmed memory element. The strength of the PMOS pull-up transistor M2 relative to the strength of the memory element determines whether the read operation will be performed correctly. The amount of current that is drawn by the addressed programmed memory element is Icr_pd. The PMOS pull-up transistor strength relative to the memory element strength is reflected in the relative sizes of the drain-source current of transistor M2 (Ics) and the memory element current Icr_pd.

If pull-up transistor M2 is sized correctly relative to the memory element that is being read (i.e., if Ics is less than Icr_pd so that the strength of M2 is correct relative to the strength of the inverter in the memory cell that is supplying signal DATA, the signal DL on line 74 will be pulled down by the memory element at times after time t3, as indicated by solid line 96. When DL is pulled below RD_TRIP at time t4, output OUT will go high, as shown by solid line 98 in FIG. 12. At times between t4 and t5, the signal OUT will therefore accurately reflect the low DATA signal that is stored in the addressed memory element.

If, on the other hand, pull-up transistor M2 is sized incorrectly relative to the memory element (i.e., M2 is too strong relative to the memory element so that current Ics is greater than the current Icr_pd), the signal DL on line 74 will not be pulled lower than RD_TRIP following assertion of the address signal at t3, as indicated by dotted line 100 in FIG. 9. With DL greater than RD_TRIP, the output signal OUT of output latch 80 will remain low at times t4 to t5, as indicated by dotted line 102 in FIG. 12. The low signal level of OUT between times t4 and t5 is erroneous and will result in a read error.

As the discussion of FIGS. 9-12 makes clear, transistor M2 must not be constructed so as to be too strong relative to the memory element, or it will not be possible to properly pull down signal line DL when reading a low DATA signal from a memory element, resulting in a read error.

To ensure accurate read operations, the designer of a conventional read circuit of the type shown in FIG. 4 must attempt to balance the strength of PMOS pull-up transistor relative to both the memory element inverter's current and memory element leakage currents. Proper operation will only be obtained when M2 is stronger than the leakage current of the memory elements, but is weaker than the addressed memory elements (i.e., when Ics is greater than Icr_lk, but is less than Icr_pd). However, it is not always possible to reliably achieve this desired level of balance with modern fabrication processes and modern integrated circuit designs. This is because process variations and variations in operating conditions can alter the expected values of Icr_lk, Ics, and Icr_pd. These challenges are exacerbated when operating at low power supply levels and when using large numbers of memory elements on each data line.

Figure 13:
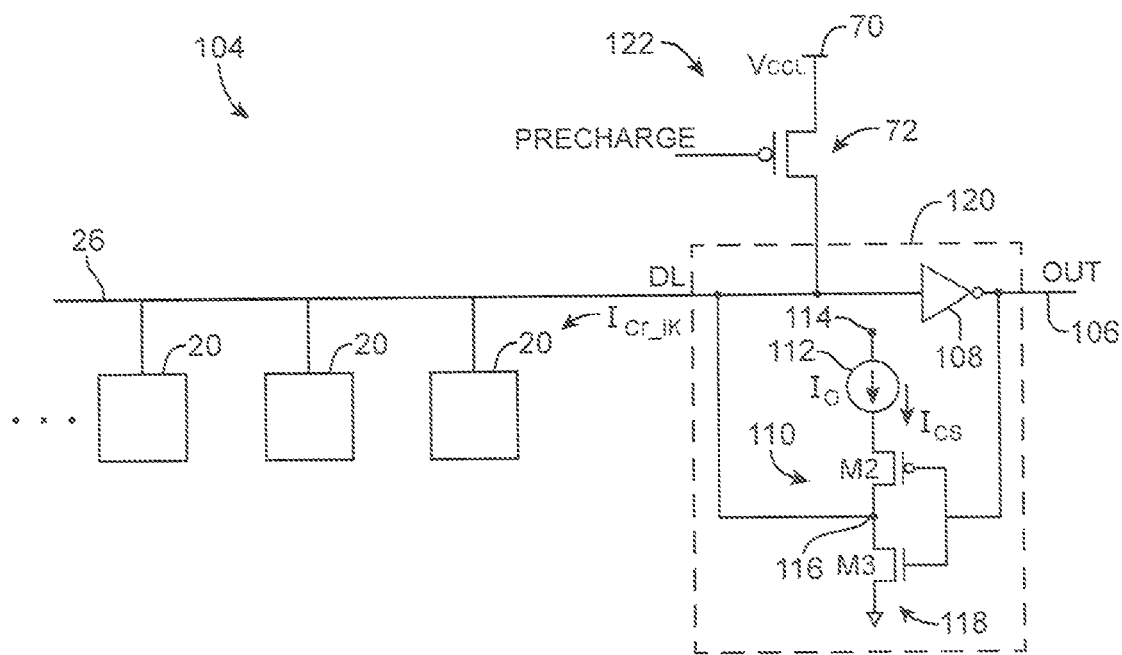
FIG. 13 is a diagram of a row of a memory element array having an output circuit in accordance with an embodiment of the present invention.

In accordance with an embodiment of the present invention, read circuitry is provided that is able to reliably read data signals from memory elements even in challenging circuit environments. Illustrative circuitry 104 in accordance with an embodiment of the present invention is shown in FIG. 13. Circuitry 104 may be implemented on an integrated circuit such as integrated circuit 10 of FIG. 1. Data may be read from a number of memory elements 20 using data line 26, as described in connection with FIGS. 2 and 3. Only a single row of memory elements 20 is shown in FIG. 13 to avoid overcomplicating the drawing. In general, however, integrated circuit 10 may contain an array with any suitable number of rows and columns of memory elements 20. Each memory element 20 may contain cross-coupled inverters as described in connection with FIG. 3.

Data line 26 may provide data signals DL that are read using read circuitry 122. Precharge transistor 72 may connected between positive power supply terminal 70 and data line 26. Power supply terminal 70 may be powered at a suitable positive power supply level. For example, power supply terminal 70 may be powered at a voltage Vcc1 that is greater than or equal to core logic power supply voltage Vcc during read operations.

Memory elements 20 are coupled to data line 26 through respective address transistors 58 (FIG. 3). As with the example of FIG. 4, when the address transistors 58 that are associated with a given row of memory elements are all off, there is generally a leakage current Icr_lk that is associated with the programmed memory elements in that row. Each programmed memory element contributes to this leakage current. The leakage current contribution from erased memory elements is generally negligible. In a typical configuration, there will be hundreds or thousands of memory elements that contribute to the leakage current on a given data line 26.

Read circuitry 122 may include precharge transistor 72 and output latch 120. Prior to reading the voltage on data line 26, precharge transistor 72 is turned on by taking signal PRECHARGE low on the gate of transistor 72. This connects terminal 70 to line 26 and pulls the voltage on line 26 high to the positive voltage Vcc1 that is supplied on terminal 70.

Output latch 80 contains an outwardly-directed inverter 108 that drives data signals DL from line 26 onto output line 106 as inverted output signals OUT. Cross-coupled inverter 110 is used to feed signal OUT back onto line 26. Inverter 110 is inwardly-directed, because it drives signals onto line 26 from output line 106. Inverter 110 may include PMOS transistor M2 and NMOS transistor M3. The PMOS transistor M2 is connected to positive power supply terminal 114 and serves as a pull-up transistor for data line 26. Power supply terminal 114 may be powered at a suitable positive power supply level such as a voltage Vcc1 that is greater than or equal to core logic power supply voltage Vcc during read operations.

Current source 112 provides a fixed value of current Io. Current source 112 may be connected to one of the source-drain terminals of transistor M2. The other source-drain terminal of transistor M2 may be connected to node 116. Because current source 112 is connected in series with transistor M2, the source-drain current of transistor M2 is fixed at Io (i.e., Ics of transistor M2 is forced to assume the value Io due to the operation of current source 112). By proper selection of the current source magnitude Io, the magnitude of current Ics can be stabilized at a known desired value over a wide range of process and operating parameter conditions. This allows current Ics to be reliably maintained at a level that is greater than Icr_lk and less than the amount of current produced by a given addressed memory element during a read operation (Icr_pd).

Illustrative current source circuits that may be used to implement current source 112 of FIG. 13 are shown in FIGS. 14-21.

Figure 14:
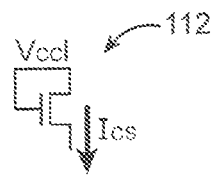
FIGS. 14, 15, 16, 17, 18, 19, 20, and 21 are circuit diagrams of illustrative current source circuitry that may be used in an output circuit for a memory array data line in accordance with an embodiment of the present invention.

In the current source 112 of FIG. 14, an NMOS transistor is used to implement the current source.

Figure 15:
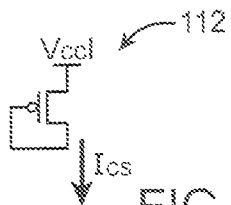

Current source 112 of FIG. 15 uses a PMOS design.

Figure 16:
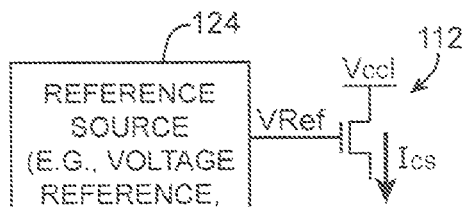
Figure 17:
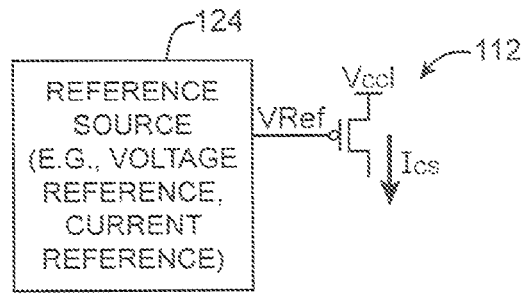

Current sources 112 of FIGS. 16 and 17 have a reference source 124 such as a voltage reference or current reference. If desired, reference source 124 may be connected to the gate of a transistor as shown in FIGS. 16 and 17 (e.g., to supply a known voltage reference Vref as a gate control signal). Reference source 124 may be implemented using any suitable known reference circuit. As an example, a voltage reference circuit for reference source 124 may be implemented using a bandgap reference circuit. This is, however, merely illustrative. Any suitable current or voltage reference circuit may be used in implementing reference source 124 if desired.

Figure 18:
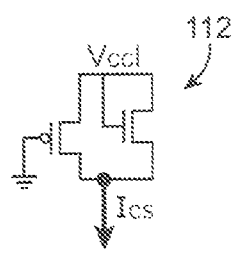
Figure 19:
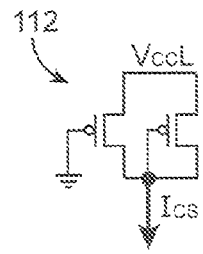

In the arrangements of FIGS. 18 and 19, a two-transistor current source architecture is used for current source 112. In the FIG. 18 example, a PMOS transistor is used that has a ground signal applied to its gate. In the FIG. 19 example, two parallel PMOS transistors are used, one of which has a grounded gate and the other of which has its gate connected to its output.

Figure 20:
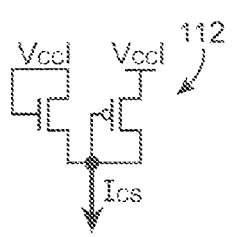
Figure 21:
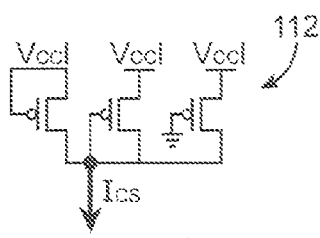

FIGS. 20 and 21 show additional current source designs that may be used for current source 112. In the FIG. 20 arrangement, an NMOS transistor is used that has its gate connected to Vcc1 and a PMOS transistor is used that has its gate connected to the output of the current source. In the FIG. 21 arrangement, three current source transistors are used: one NMOS transistor and two PMOS transistors. If desired, other current source circuits or combinations of such circuits may be used.

Figure 22:
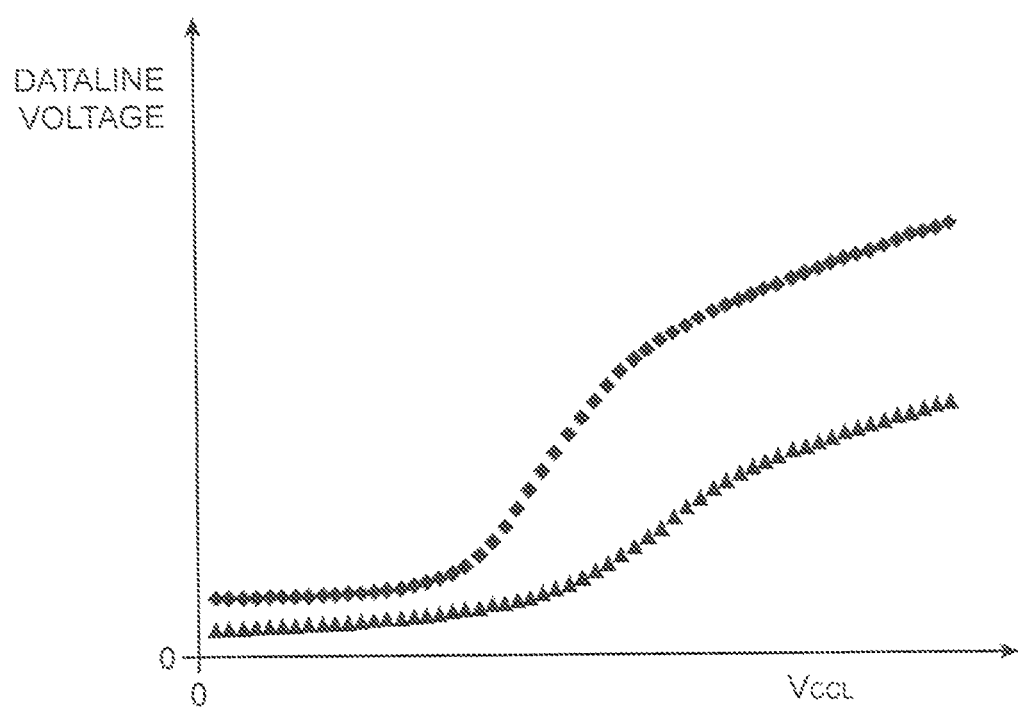
FIG. 22 is graph showing a read window for a conventional memory array read circuit.
Figure 23:
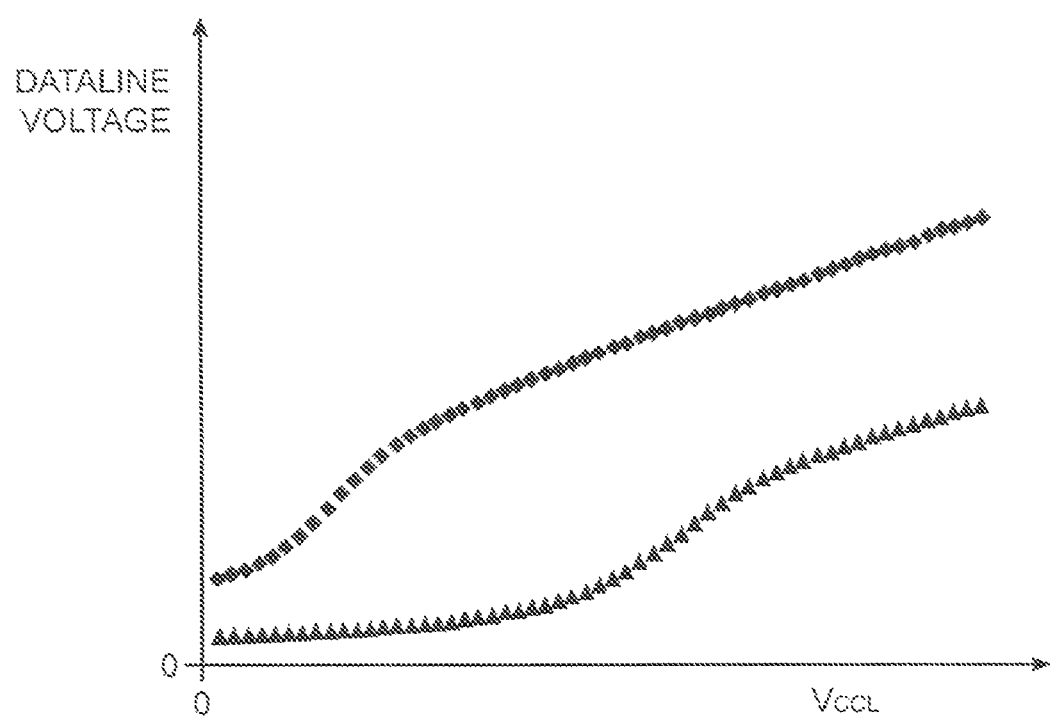
FIG. 23 is a graph showing an illustrative read window for a memory array read circuit in accordance with an embodiment of the present invention.

The operation of a conventional read circuit arrangement of the type shown in FIG. 4 and the operation of a read circuit in accordance with an embodiment of the present invention may be compared using graphs of the type shown in FIGS. 22 and 23. The performance of the conventional read circuit of FIG. 4 is represented by the graph of FIG. 22. The performance of a read circuit in which the feedback inverter of the output latch has a series-connected current source such as current source 112 of FIG. 13 is represented by the graph of FIG. 23.

The graphs of FIGS. 22 and 23 illustrate how the strength of PMOS pull-up transistor M2 compares to the leakage current Icr_lk and memory element read current Icr_pd. In each of these graphs, the upper curve (represented by diamonds) is indicative of the strength of M2 (current Ics) relative to leakage current Icr_lk, whereas the lower curve (represented by triangles) is indicative of the strength of M2 relative to the strength of an individual addressed memory element during a read operation (i.e., relative to current Icr_pd due to the strength of the inverter within the memory element that drives data signal DATA onto the data line). Both of these curves are plotted as a function power supply voltage Vcc1.

As described in connection with the timing diagrams of FIGS. 5-12, proper data read operations require that the output latch switching threshold voltage RD_TRIP be maintained at a voltage that lies below the voltage to which leakage pulls down data line DL after PRECHARGE is released (as shown by line 94 of FIG. 5) and above the voltage to which a programmed memory element that is being addressed pulls down data line DL during a read operation (as shown by line 96 of FIG. 9). When these criteria are met, the voltage RD_TRIP lies between the upper and lower bounds of FIGS. 22 and 23. In particular, at a given Vcc1 value, the value of RD_TRIP will lie below the upper bound represented by the upper curve of FIG. 22 at that Vcc1 value and will lie above the lower bound represented by the lower curve of FIG. 22 at that Vcc1 value.

An appropriately-selected RD_TRIP value such as this will ensure that during a read operation of the type described in connection with FIGS. 5-8 the leakage current Icr_lk will not erroneously pull the data line signal DL so low that the output signal OUT flips from low to high. It will also ensure that during a read operation of the type described in connection with the example of FIGS. 9-12, the memory element inverter (e.g., inverter 52 of FIG. 3) that is driving a low data signal DATA onto the data line when a programmed memory element is addressed will be sufficiently strong to pull the signal DL low.

The voltage separation between the upper and lower curves of FIGS. 22 and 23 is sometimes referred to as the "read window" of a memory array read circuit. If the read window is small (i.e., if the distance between the upper curve and lower curves is small), it is relatively difficult to select a voltage RD_TRIP that will ensure reliable read operations. When a circuit design has a small read window, fabrication process variations and operating parameter variations (e.g., variations in operating temperature and operating voltage) may cause the voltage RD_TRIP to fall out of the read window. In this situation, the memory element read operations will not be performed satisfactorily.

To improve reliability, it would be desirable to increase the size of the read window. This would allow more margin in the design, so that expected process-induced and operating-parameter-induced performance variations could be accommodated. In conventional read circuit arrangements, there is no current source in series with the PMOS pull-up transistor in the output latch (as shown in FIG. 4), so the amount of current Ics that flows through PMOS pull-up transistor M2 can vary as a function of power supply voltage Vcc1. As shown in FIG. 22, at low levels of Vcc1, the upper curve (represented by diamonds) tends to drop to relatively low voltage levels. This behavior, which is due to the reduction in saturation current Idsat of transistor M2 at lower power supply voltages, constricts the read window and provides relatively little margin for the read circuit design to accommodate process and operational variations. In contrast, in read circuitry 122 of FIG. 13, current source 112 is connected in series with PMOS pull-up transistor M2. This helps support the current Ics at low power supply voltages Vcc1 by fixing Ics to Io, thereby raising the upper curve of the graph of FIG. 23 relative to the lower curve of the graph of FIG. 23. As a result, the read window of the circuit of FIG. 13 is substantially larger than the read window of the conventional circuit of FIG. 4.

The larger read window that is produced by the current-source-based output latch of FIG. 13 relative to conventional arrangements helps to improve the design margin for the memory element read circuitry on an integrated circuit such as a programmable logic device integrated circuit. Use of a current source in series with the pull-up transistor in the inwardly-directed inverter in the output latch helps to make data reading operations more reliable.

Figure 24:
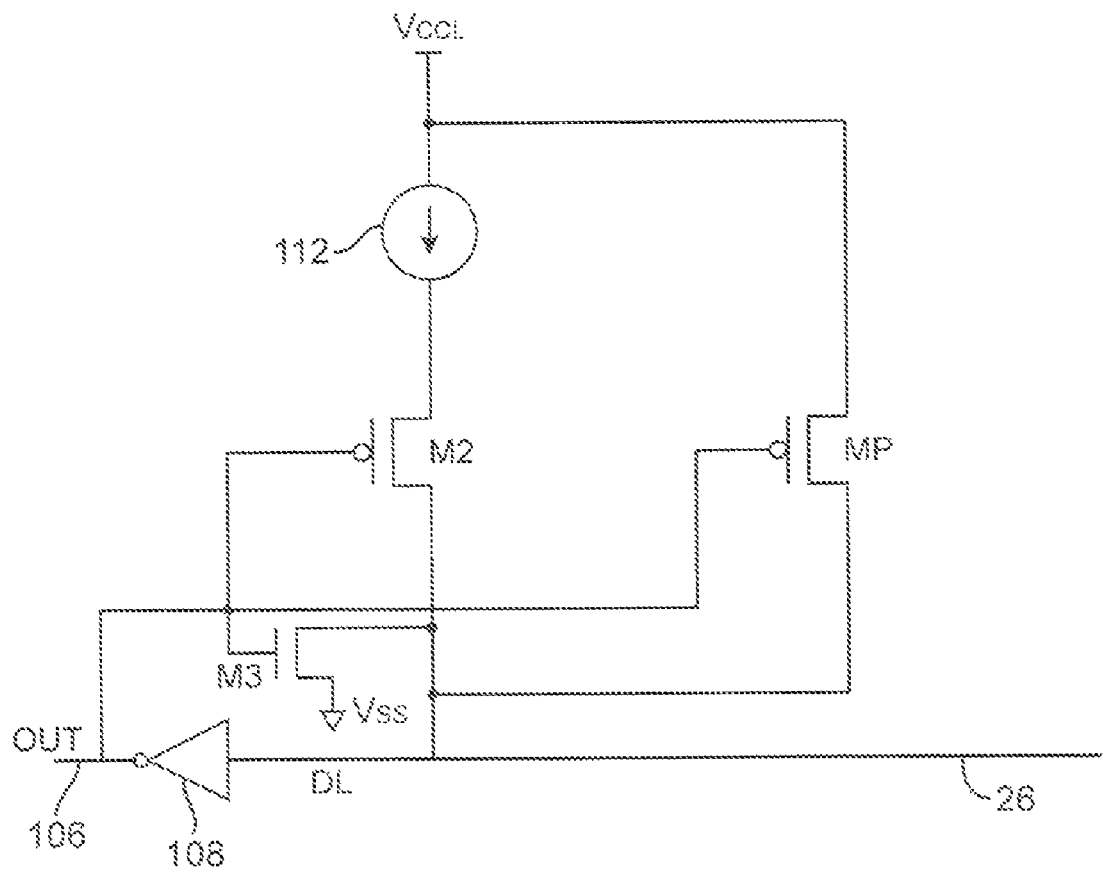
FIG. 24 is a circuit diagram of illustrative read circuitry in accordance with an embodiment of the present invention.

As shown in FIG. 24, a PMOS transistor MP may be connected in parallel with pull-up transistor M2. Current source 112 may be connected in series between transistor M2 and power supply terminal Vcc1. Transistor M2 may be connected in series between current source 112 and transistor M3. Transistor MP may be connected in series between power supply voltage Vcc1 and transistor M3 and may be connected in parallel with current source 112 and transistor M2.

When integrated circuit 10 is being powered up and current source 112 is fully operational, transistor M2 will be on and will help output latch 120 settle to a known state. If current source 112 contains NMOS transistors (e.g., current source 112 of FIG. 16), transistor MP can help to pull the signal DL on the data line fully to positive power supply voltage level Vcc1 (i.e., when output signal OUT is low). The sizes of pull-up transistors M2 and MP need not be equal. For example, pull-up transistor M2 may be larger than pull-up transistor MP. If desired, additional parallel and series-connected transistors may be used.

The foregoing is merely illustrative of the principles of this invention and various modifications can be made by those skilled in the art without departing from the scope and spirit of the invention.

What is claimed is:

1. Circuitry on an integrated circuit, comprising:
a data line;
a plurality of memory elements coupled to the data line; and
an output latch connected to the data line through which data signals from the data line are read during data reading operations, wherein the output latch contains a pull-up transistor that is connected to the data line and a current source connected in series with the pull-up transistor.

2. The circuitry defined in claim 1 wherein the output latch comprises:
an outwardly-directed inverter through which signals from the data line are driven onto an output line; and
a cross-coupled inwardly-directed inverter through which signals from the output line are fed back to the data line, wherein the pull-up transistor is contained within the inwardly-directed inverter.

3. The circuitry defined in claim 2 wherein the pull-up transistor comprises a p-channel metal-oxide-semiconductor transistor.

4. The circuitry defined in claim 3 further comprising a positive power supply terminal, wherein the current source is connected in series between the positive power supply terminal and the p-channel metal-oxide-semiconductor transistor.

5. The circuitry defined in claim 1 wherein the current source comprises an n-channel metal-oxide semiconductor transistor.

6. The circuitry defined in claim 5 wherein the n-channel metal-oxide-semiconductor transistor in the current source has a gate and wherein the current source further comprises a voltage reference connected to the gate.

7. The circuitry defined in claim 1 wherein each of the memory elements comprises an address transistor that couples that memory element to the data line.

8. The circuitry defined in claim 1 wherein each of the memory elements comprises a pair of cross-coupled inverters, wherein one of the cross-coupled inverters in each memory element has an output that is coupled to the data line by a respective address transistor and wherein the other of the cross-coupled inverters in each memory element produces a static control signal at its output that is applied to the gate of a programmable n-channel metal-oxide-semiconductor transistor in a region of programmable logic on the integrated circuit.

9. The circuitry defined in claim 1 further comprising a p-channel metal-oxide-semiconductor transistor connected in parallel with the current source and the pull-up transistor.

10. An integrated circuit comprising:
a memory array having a plurality of programmable memory elements, each memory element having a pair of cross-coupled inverters and each having an associated control output that supplies a static control signal in accordance with a data bit that is stored on that memory element;
a plurality of programmable transistors having gates that receive the static control signals;
a plurality of address transistors;
a plurality of data lines, wherein the pair of cross-coupled inverters in each of the memory elements is connected one of the data lines by an associated one of the address transistors; and
read circuitry associated with each data line, wherein the read circuitry associated with each data line includes a current source and at least one pull-up transistor that is connected between the current source and that data line.

11. The integrated circuit defined in claim 10 wherein the current source in the read circuitry associated with each data line comprises a bandgap reference circuit.

12. The integrated circuit defined in claim 10 wherein the plurality of programmable transistors comprise programmable core logic on a programmable logic device integrated circuit.

13. The integrated circuit defined in claim 10 wherein the pull-up transistor in the read circuitry associated with each data line comprises a p-channel metal-oxide-semiconductor transistor.

14. The integrated circuit defined in claim 10 wherein the read circuitry associated with each data line includes an output latch that is connected between that data line and an output line and through which data is read from the memory elements of that data line by turning on a selected one of the address transistors and wherein the p-channel metal-oxide-semiconductor transistor in the read circuitry of each data line is contained within the output latch of the read circuitry of that data line.

15. The integrated circuit defined in claim 14 wherein the read circuitry associated with each data line comprises a precharge transistor.

16. A method of reading data through a data line on an integrated circuit to which a plurality of integrated circuit memory elements are coupled through respective address transistors, comprising:
with a precharge transistor that is coupled to the data line, precharging the data line to a positive voltage;
with one of the address transistors, electrically connecting a selected one of the memory elements to the data line;
with an output latch that is connected to the data line, supplying data from the selected memory element to an output line;
with an inwardly-directed inverter in the output latch that has a pull-up transistor connected to the data line, pulling up the data line when the output line has a logic high value; and
with a current source that is connected in series with the pull-up transistor, supplying a fixed current to the pull-up transistor during data read operations from the memory elements.

17. The method defined in claim 16 further comprising supplying a static control signal from each of the integrated circuit memory elements to the gate of a respective n-channel metal-oxide-semiconductor transistor in programmable logic device core logic.

18. The method defined in claim 16 further comprising:
with a transistor that is connected in parallel with the current source and the pull-up transistor, pulling the data line to a positive power supply voltage when the output line has a logic low value.

19. The method defined in claim 16 further comprising:
with a bandgap voltage reference, supplying reference voltage to a transistor in the current source.

20. The method defined in claim 16 further comprising:
with an outwardly-directed inverter in the output latch that is cross-coupled with the inwardly-directed inverter, supplying the data that was supplied to the data line from the selected memory element to the output line.

* * * * *